(12) United States Patent
Stewart et al.

(10) Patent No.: US 7,741,638 B2
(45) Date of Patent: Jun. 22, 2010

(54) CONTROL LAYER FOR A NANOSCALE ELECTRONIC SWITCHING DEVICE

(75) Inventors: Duncan Stewart, Menlo Park, CA (US); Douglas Ohlberg, Mountain View, CA (US); R. Stanley Williams, Portola Valley, CA (US); Philip J. Kuekes, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 488 days.

(21) Appl. No.: 11/287,113

(22) Filed: Nov. 23, 2005

(65) Prior Publication Data

US 2007/0117256 A1 May 24, 2007

(51) Int. Cl.
*H01L 23/58* (2006.01)

(52) U.S. Cl. .................. 257/48; 257/2; 257/3; 257/608; 257/E27.009

(58) Field of Classification Search .............. 257/2, 257/48, 3, 608, E27.009
See application file for complete search history.

(56) References Cited

U.S. PATENT DOCUMENTS

| | | | |
|---|---|---|---|
| 6,128,214 A | 10/2000 | Kuekes et al. | |
| 6,459,095 B1 | 10/2002 | Heath et al. | |
| 6,825,489 B2 | 11/2004 | Kozicki | |
| 6,891,186 B2 | 5/2005 | Aono et al. | |
| 2004/0159835 A1 | 8/2004 | Krieger et al. | |
| 2004/0178401 A1* | 9/2004 | Ovshinsky et al. | ............. 257/2 |
| 2005/0014325 A1 | 1/2005 | Aono et al. | |
| 2005/0162907 A1 | 7/2005 | Campbell | |

FOREIGN PATENT DOCUMENTS

| | | |
|---|---|---|
| JP | 2005039103 | 2/2005 |
| KR | 102004003573 A | 4/2004 |
| WO | WO02/078056 | 10/2002 |

OTHER PUBLICATIONS

Terabe, K. et al., "Quantized conductance atomic switch," Nature, vol. 433, (Jan. 6, 2005), pp. 47-50.
Terabe, K. et al. "Ionic/electronic mixed conductor tip of a STM as a metal atom source for nanostructuring," Appl Phys Lett, vol. 80, No. 21, (May 27, 2002), pp. 4009-4011.
Hewlett-Packard Development Company, L.P., Office Action issued by Korean Intellectual Property Office, Application No. 2008-7012213, Dated Feb. 23, 2010.

* cited by examiner

*Primary Examiner*—Tan N Tran

(57) ABSTRACT

A control layer for use in a junction of a nanoscale electronic switching device is disclosed. The control layer includes a material that is chemically compatible with a connecting layer and at least one electrode in the nanoscale switching device. The control layer is adapted to control at least one of electrochemical reaction paths, electrophysical reaction paths, and combinations thereof during operation of the device.

30 Claims, 4 Drawing Sheets

CONTROL LAYER FOR A NANOSCALE ELECTRONIC SWITCHING DEVICE

BACKGROUND

The present disclosure relates generally to nanoscale electronics, and more particularly to control layers used in nanoscale electronic switching devices.

Electronic switching devices including two electrodes (for example, a bottom electrode and a top electrode) and an electronic switching layer/film at the junction of the two electrodes are known. Such devices may be useful, for example, in the fabrication of devices based on electrical switching, such as molecular wire crossbar interconnects for signal routing and communications, molecular wire crossbar memory, molecular wire crossbar logic employing programmable logic arrays, multiplexers/demultiplexers for molecular wire crossbar networks, molecular wire transistors, and the like. Such devices may further be useful, for example, in the fabrication of devices based on optical switching, such as displays, electronic books, rewritable media, electrically tunable optical lenses, electrically controlled tinting for windows and mirrors, optical crossbar switches (for example, for routing signals from one of many incoming channels to one of many outgoing channels), and the like.

The choice of materials used in the fabrication of electronic switching devices may be limited because some electrode materials may be essentially incompatible with some switching materials. The term "incompatible," as referred to herein, may mean that the electrode and the switching materials are physically and/or chemically unstable when brought in contact, or the term may mean that the switching material exhibits substantially uncontrolled, undesirable, and/or non-existent electronic switching when incorporated with the electrode materials in an electronic switching device.

The fabrication of devices that incorporate the electronic switching devices often include subsequent processing steps beyond the formation of the device. In some instances however, the materials used for the switching layer/film of the device may be unstable to withstand such subsequent processing steps.

As such, it would be desirable to provide a nanoscale electronic device that includes controllable and compatible materials that are also suitable for use with subsequent processing procedures.

SUMMARY

A control layer for use in a junction of a nanoscale electronic switching device is disclosed. The control layer includes a material that is chemically compatible with a connecting layer and at least one electrode in the nanoscale switching device. The control layer is adapted to control at least one of electrochemical reaction paths, electrophysical reaction paths, and combinations thereof during operation of the device.

BRIEF DESCRIPTION OF THE DRAWINGS

Objects, features and advantages will become apparent by reference to the following detailed description and drawings, in which like reference numerals correspond to similar, though not necessarily identical components. For the sake of brevity, reference numerals having a previously described function may not necessarily be described in connection with subsequent drawings in which they appear.

DETAILED DESCRIPTION

Embodiments of the present disclosure advantageously provide a switching mechanism for use in electronic and/or optical devices. The switching mechanism includes one or more connecting layers that are electrophysically and/or electrochemically switchable. Embodiment(s) of the device include control layer(s) that advantageously enable control of the electrophysical and/or electrochemical reaction paths, thus enabling control of the device properties. Without being bound to any theory, it is believed that the control layer(s) substantially enhance device performance. Non-limitative examples of enhanced device performance include enhanced thermal stability, enhanced chemical stability, enhanced speed, enhanced reliability, and/or enhanced life span, and/or combinations thereof. Still further, the device including the control layers may provide a substantially predictable and repeatable switching device. Further, the control layer(s) may be substantially compatible with subsequent semiconductor processing techniques and roll-to-roll electronic manufacturing processes. As such, the embodiment(s) of the switching mechanism may advantageously be included in various semiconductors, such as, for example, CMOS.

As used herein, the term "nanoscale" refers to a device having at least one dimension less than about 100 nm.

Figure 1:
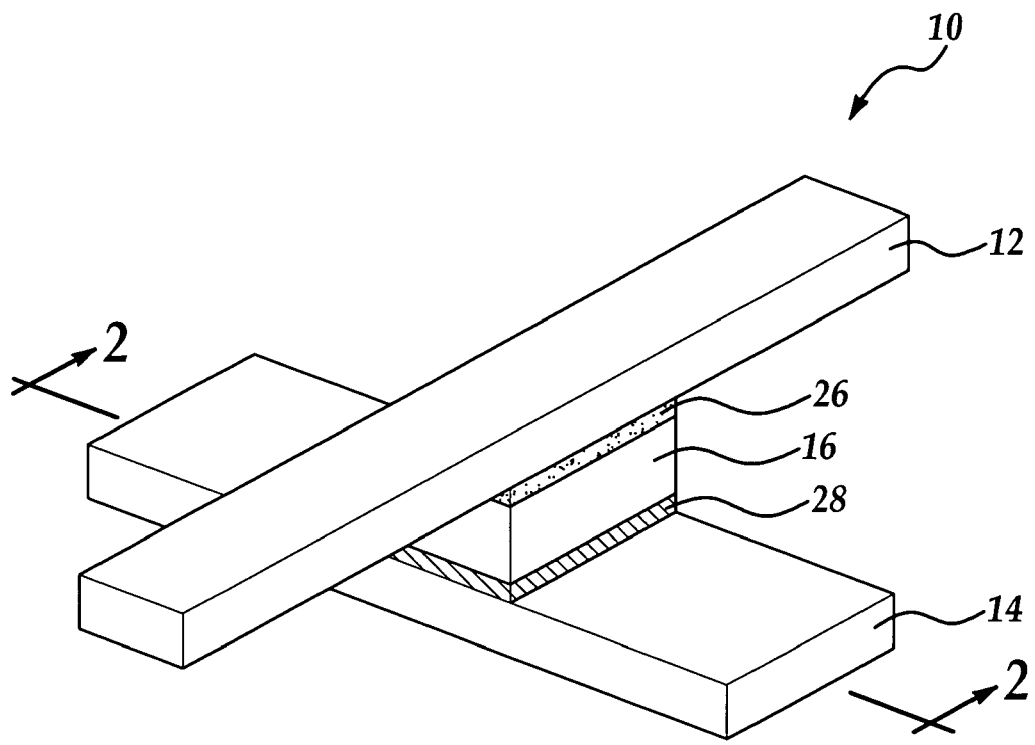
FIG. 1 is a perspective schematic representation of two electrodes, with a connecting layer and two control layers at the intersection of the two electrodes.
Figure 2:
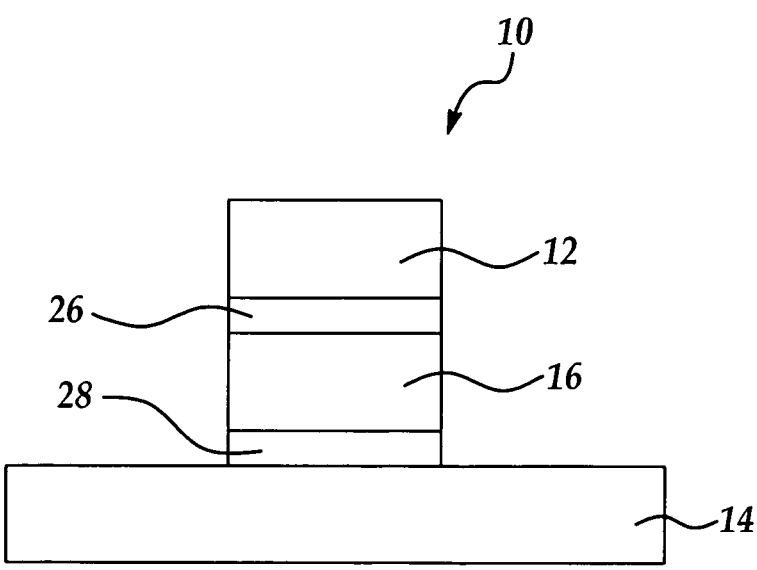
FIG. 2 is a cross-sectional schematic view taken along line 2-2 of FIG. 1.

Referring now to FIGS. 1 and 2, an embodiment of a switching device 10 is depicted. The switching device 10 includes a top electrode 12 crossing a bottom electrode 14 at a non-zero angle to form an intersection, or junction. A connecting layer(s) 16 is operatively disposed in the junction. One or more control layer(s) 26, 28 is operatively disposed between the connecting layer 16 and the top electrode 12 and/or between the connecting layer 16 and the bottom electrode 14.

It is to be understood that the terms "top electrode" and "bottom electrode" are not intended to be limited to, nor necessarily meant to convey a spatial orientation, but rather are used for illustrative purposes to differentiate two opposed electrodes in any spatial orientation (top, bottom, side, angularly offset, and/or the like). However, it is to be understood that in fabrication situations, "top" and "bottom" may signify a specific spatial orientation as defined by, e.g., planar deposition processes.

The electrodes 12, 14 may be made of any suitable electrode material. Such materials include, but are not limited to metallic elements, metallic compounds, metallic alloys, semiconducting elements, semiconducting compounds, semiconducting alloys, conductive organic compounds, and combinations thereof. Specific non-limitative examples of the electrode materials include platinum, aluminum, molybdenum, tungsten, palladium, titanium, chromium, gold, silicon, germanium, indium phosphide, gallium arsenide, silicon germanium, and/or combinations thereof.

In an embodiment of a method of forming an embodiment of the switching device 10, one or more connecting layer(s) 16 is established or operatively disposed in the junction via a growth process(es), a deposition process(es), or combinations thereof. Non-limitative examples of such processes include vacuum deposition, physical epitaxy, chemical epitaxy, atomic layer deposition, electrochemical growth, organic monolayer self-assembly, Langmuir-Blodgett transfer, or combinations thereof.

It is to be understood that the connecting layer 16 is made of a material that changes its electrical and/or optical properties under the influence of an electrical potential that is applied across the junction between the electrodes 12, 14. All or a portion of the material, molecule, or compound used to form the connecting layer 16 may generally be unstable and capable of being switched via electrophysical and/or electrochemical processes. In an embodiment, the connecting layer(s) 16 are electronic or ionic conductors. The connecting layer(s) 16 may be homogenous and/or heterogeneous (e.g. portion(s) of layer 16 may be active/switchable), and may be modified to have higher or lower electrical conductivity via an electrochemical or electrophysical reaction. It is to be understood that the electrochemical reaction and/or electrophysical reaction occurs at the active/switchable portions of the connecting layer 16, and as such, may occur substantially homogeneously, heterogeneously, or both across the device 10.

In a non-limitative embodiment, the connecting layer 16 includes one or more relatively unstable layers having therein at least one of organic compounds, inorganic compounds, and combinations thereof. It is to be understood that the connecting layer 16 is generally less stable than the control layer(s) 26, 28. Non-limitative examples of such relatively unstable materials include pnictides (non-limitative examples of which include nitrides, phosphides, arsenides, antimonides, and/or the like), chalcogenides (non-limitative examples of which include oxides (i.e., mixed valence oxide compounds), sulfides, selenides, tellurides, and/or the like), molecular deformable media (non-limitative examples of which include alkanes, carboxylic acids, pthalocyanines, and/or porphyrins), porous media (non-limitative examples of which include zeolites), semiconductors that may be doped by electrostatically driven diffusion (e.g. conducting polymers), and/or combinations thereof. Further specific non-limitative examples include $Ag_2S$, polyaniline, cadmium stearate, copper sulfides, germanium selenides, germanium silver selenides, platinum oxides, titanium oxides (e.g., $Ti_3O_5$ or $Ti_xO_y$, where 2y/x does not equal an integer), titanium carbides, aluminum oxides ($Al_xO_y$, where "x" is not 2 and "y" is not 3), silver oxides ($Ag_xO_y$, where "x" is not 2 and "y" is not 1), tungsten oxides (e.g., $WO$ or $W_xO_y$, where "y" is not 2 or 3), tantalum oxides ($Ta_xO_y$, except $TaO_2$ and $Ta_2O_5$), $C_{16}H_{32}O_2$, $C_{17}H_{34}O_2$, $C_{18}H_{36}O_2$, $C_{19}H_{38}O_2$, $C_{20}H_{40}O_2$, $C_{21}H_{42}O_2$, $C_{22}H_{44}O_2$, $C_{14}H_{12}Cl_2N_4O_2$, $C_{15}H_{16}N_2O_3$, and/or combinations thereof.

The connecting layer 16 may be a monolayer, may include various sub-layers (i.e. multilayer), or may be a thin film. In the multilayer embodiment, it is to be understood that any desirable number of sub-layers may be incorporated with the connecting layer 16. It is to be understood that the materials listed herein may be used for the various sub-layers. Further, the materials for the sub-layers may be substantially the same or different than the connecting layer 16. In an embodiment of a method of forming the switching device 10, the connecting layer 16 and its various sub-layers may be established sequentially or simultaneously, depending, at least in part, on the materials selected for the various layers.

FIGS. 1 and 2 also depict control layers 26, 28 formed between the connecting layer 16 and each of the top and bottom electrodes 12, 14, respectively. The control layers 26, 28 are chemically compatible with the respective electrode(s) 12, 14 and the connecting layer 16. Generally, the control layers 26, 28 will not uncontrollably react with the electrode(s) 12, 14, nor will they uncontrollably react with the connecting layer 16. The control layers 26, 28 advantageously moderate the reaction between the electrode(s) 12, 14 and the connecting layer 16. Without being bound to any theory, it is believed that the electrochemical and/or electrophysical reactions may advantageously be controlled by controlling the materials of the device 10 that contact each other. As such, the control layers 26, 28 advantageously engineer or control the electrochemical and electrophysical switching of the device 10.

It is to be understood that the control layers 26, 28 may act as a mediator (a source or a sink) of material (non-limitative examples of which include atoms, clusters of atoms, or molecules) for the connecting layer 16. In an embodiment, the control layers 26, 28 may act as a source of dopants that are electrically driven into the connecting layer 16 to change its conductivity. In another embodiment, the control layers 26, 28 may act as a sink for dopants that are electrically driven out of the connecting layer 16 to change its conductivity. In still other embodiments, the control layers 26, 28 may act as a source of material for an ionic conductor (e.g. silver or $Ag_2S$) or for a porous material. In further embodiments, the control layers 26, 28 may act as a source of material for growth of nanoparticles, filaments, or nanowires.

The control layers 26, 28 may also enhance the performance of the device 10 and alter the properties of the device 10. For example, the device 10 properties may change depending, at least in part, on the material selected for the control layers 26, 28.

The control layers 26, 28 may consist of one or more substantially homogeneous or heterogeneous thin films, which may be conducting or partially conducting. In an embodiment, the control layers 26, 28 include relatively stable compounds selected from organic compounds, inorganic compounds, and combinations thereof. Non-limitative examples of such relatively stable materials include pnictides (non-limitative examples of which include nitrides, phosphides, arsenides, antimonides, and the like), chalcogenides (non-limitative examples of which include stable oxides (i.e., single valence oxide compounds), sulfides, selenides, tellurides, and the like), carbides, silicides, germanides, organic monolayers, organic multilayers, organic thin films, or combinations thereof. Further specific non-limitative examples of materials suitable for control layers 26, 28 include silver, $CuI_2$, $CuCl_2$, copper, $Pt(OH)_2$, platinum oxide, titanium oxides (e.g., $TiO$, $TiO_2$, $Ti_2O_3$, $Ti_xO_y$, where 2y/x is an integer), titanium carbide, aluminum oxide ($Al_2O_3$), silver oxide ($Ag_2O$), tungsten oxides ($WO_2$, $WO_3$), silicon oxide, tantalum oxides ($Ta_2O_5$, $TaO_2$), silicon nitride, or combinations thereof.

In an embodiment, each of the control layers 26, 28 has a thickness (generally a vertical thickness) ranging between about an atomic monolayer and about 10 nm. The lateral dimensions are defined, at least in part, by the fabrication method selected. In a non-limitative example, the lateral dimensions of each of the control layers 26, 28 range from about 0.1 µm to about 10 µm using lithographic techniques, and range from about 1 nm to about 100 nm using nanopatterning techniques (a non-limitative example of which includes nanoimprint lithography). Examples of other techniques for forming the control layers 26, 28 include, but are not limited to growth process(es), deposition process(es), or combinations thereof. Non-limitative examples of such processes include vacuum deposition, physical epitaxy, chemical epitaxy, atomic layer deposition, electrochemical growth, organic monolayer self-assembly, Langmuir-Blodgett transfer, or combinations thereof. Still further, it is to be understood that the control layers 26, 28 may be formed via a controlled chemical reaction between two of the selected materials, for example, between the top electrode 12 and the connecting layer 16 and/or between the bottom electrode 14 and the connecting layer 16.

As previously described, the control layer(s) 26, 28 may be paired with the electrode(s) 12, 14 and/or with the connecting layer 16 so that the elements 12, 14, 16, 26, 28 are compatible with the respective element(s) that they contact. The following tables illustrate non-limiting examples of various material pairs that are suitably compatible with each other according to embodiment(s) of the present disclosure.

TABLE 1

Control Layer and Connecting Layer Pairs

| Control Layer | Connecting Layer |
| --- | --- |
| Source of ions for an ionic conductor (e.g., silver) | Ionic Conductors (e.g., $A_2S$) |
| Source of dopant for conductive polymer (e.g., $CuI_2$) | Conducting polymers (e.g., polyaniline) |
| Source of metal for growth of nanoparticles (e.g., $Pt(OH)_2$, $CuCl_2$) | Deformable media (e.g., polymer or molecular film) |
| Source of metal for growth of filaments or nanowires (e.g., Cu, Ag) | Porous materials (e.g., zeolites) |
| Titanium carbide or Platinum oxide Oxide tunnel barrier (e.g., $PtO_x$, $AlO_x$) | Cadmium stearate Redox molecules (e.g., rotaxane molecules) or Redox nanoparticles (Platinum nanoparticles) |

TABLE 2

Control Layer and Electrode Pairs

| Control Layer | Electrode |
| --- | --- |
| Metal Carbide (e.g., titanium carbide) | Metal (e.g., titanium) |
| Metal Oxide (e.g., platinum oxide) | Metal (e.g., platinum) |

Figure 3A:
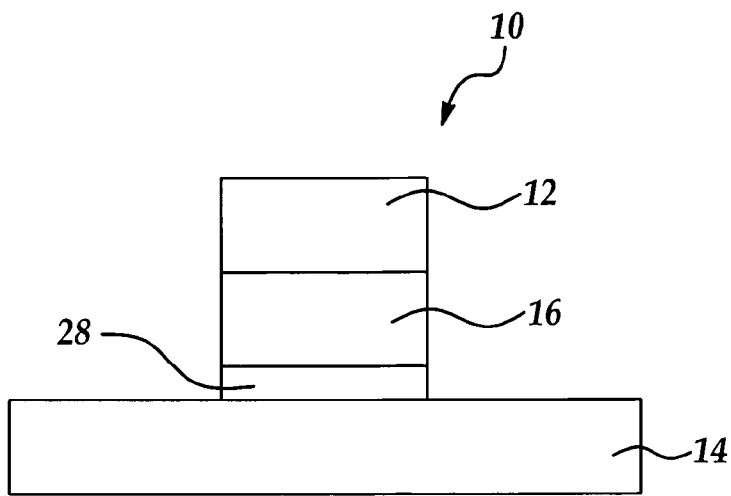
FIG. 3A is a schematic representation of two electrodes, with a control layer under the connecting layer at the intersection of the two electrodes.
Figure 3B:
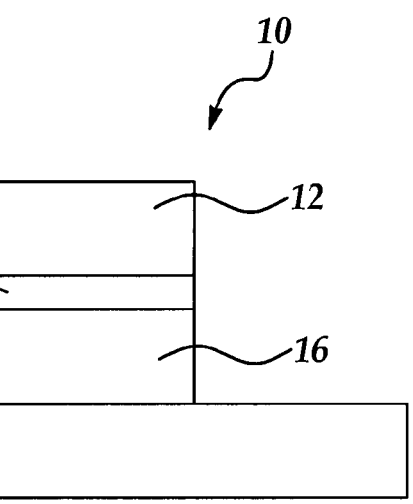
FIG. 3B is a schematic representation of two electrodes, with a control layer above the connecting layer at the intersection of the two electrodes.
Figure 3C:
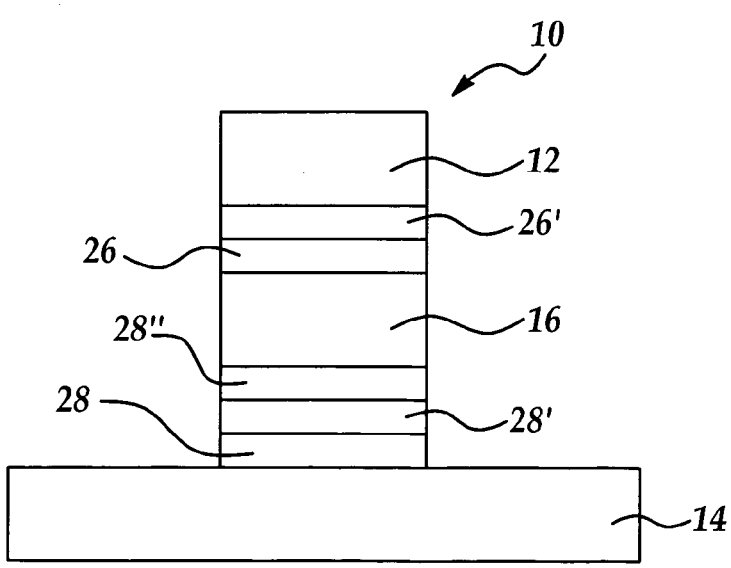
FIG. 3C is a schematic representation of two electrodes, with a plurality of control layers above and below the connecting layer at the intersection of the two electrodes.

Referring now to FIGS. 3A through 3C together, alternate embodiments of the device 10 are depicted. FIG. 3A illustrates an embodiment having one control layer 28 between the connecting layer 16 and the bottom electrode 14. In this embodiment, the control layer 28 is selected so that it is compatible with both the connecting layer 16 and the bottom electrode 14. FIG. 3B illustrates an alternate embodiment having one control layer 26 between the connecting layer 16 and the top electrode 12. In this embodiment, the control layer 26 is selected so that it is compatible with both the connecting layer 16 and the top electrode 12.

FIG. 3C illustrates another alternate embodiment having a plurality of control layers 26, 26' between the top electrode 12 and the connecting layer 16 and a plurality of control layers 28, 28', 28" between the bottom electrode 14 and the connecting layer 16. In this embodiment, control layer 26' is selected so that it is compatible with the top electrode 12, and the control layer 28 is selected so that it is compatible with the bottom electrode 14. The other control layers 26, 28" are selected so that they are compatible with the connecting layer 16. It is to be understood that each of the layers 26, 26', 28, 28', 28" is also compatible with the other respective layers 26, 26', 28, 28', 28" that it contacts (for example, layer 28' is compatible with layers 28, 28"). It is to be understood that any number of control layers 26, 28 may be established between the connecting layer 16 and the respective electrodes 12, 14.

The control layers 26, 28 may advantageously contribute to thermal and/or chemical stability of the device 10. Dissimilar materials generally enable the electrochemical or electrophysical switching. In an embodiment of the device 10 having a plurality of control layers 26, 26', 28, 28', 28" (shown in FIG. 3C), some of the layers (28' for example) may advantageously control the interaction between other layers (28 and 28" for example).

In an embodiment, one or both of the connecting layer(s) 16 and control layer(s) 26, 28 are formed of a material, molecule, or compound that may be adapted to be substantially compatible with subsequent semiconductor processing, such as, for example, CMOS processing. Other processing techniques with which the connecting layer(s) 16 and control layer(s) 26, 28 may be compatible include, but are not limited to MOS processing, bipolar processing, silicon processing, silicon-germanium processing, gallium arsenide processing, III-V processing, or II-VI processing.

Figure 4:
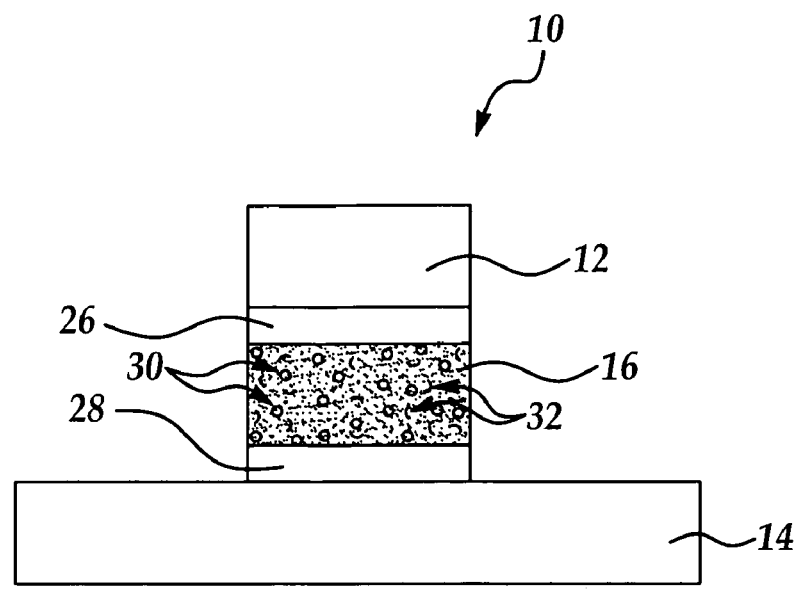
FIG. 4 is a schematic representation of two electrodes, with two control layers and an alternate embodiment of the connecting layer at the intersection of the two electrodes.

Referring now to FIG. 4, an alternate embodiment of the switching device 10 is depicted. In this non-limitative example, the connecting layer 16 has nanoparticles 30 and/or phase-segregated compounds 32 embedded therein. Non-limitative examples of suitable nanoparticles 30 include copper, silver, gold, palladium, or platinum nanoparticles, and non-limitative examples of suitable phase-segregated compounds 32 include non-stoichiometric chalcogenide compounds, such as, for example, $Cu_{2+\delta}S$ and $Ag_{2+\delta}S$.

It is to be understood that the nanoparticles 30 and/or phase-segregated compounds 32 may be added to the material to form the connecting layer 16 prior to the layer 16 being disposed in the junction. Further, it is to be understood that the particles 30 or compounds 32 may be substantially homogeneously or substantially heterogeneously mixed throughout the material. Further, it is to be understood that areas of the connecting layer 16 may have substantially homogeneously mixed nanoparticles 30 and/or phase-segregated compounds 32; while other areas of the connecting layer 16 may have substantially heterogeneously mixed nanoparticles 30 and/or phase-segregated compounds 32.

While the embodiment depicted in FIG. 4 shows the control layers 26, 28 and the connecting layer 16 including nanoparticles 30 and phase-segregated compounds 32, it is to be understood that all, a combination of some, or none of these features 30, 32 may be included in the switching device 10.

Figure 5:
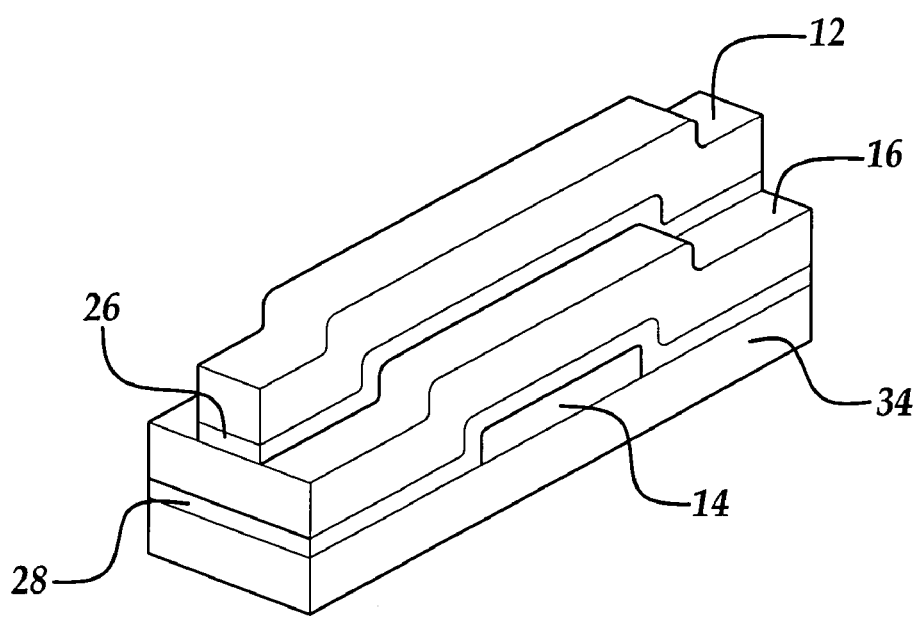
FIG. 5 is a schematic perspective view of an alternate embodiment of two electrodes, with a connecting layer and two control layers therebetween.

FIG. 5 depicts another embodiment of the switching device 10. In this embodiment, bottom electrode 14 is established on a substrate 34. It is to be understood that any suitable substrate material may be used, and in an embodiment, the substrate 34 is silicon, glass, polymeric materials (non-limitative examples of which include poly(ethylene terephthalate) (PET), polyimides, polyesters, polyethylene naphthalate (PEN), polyethersulfone (PES), or the like), III-V or II-VI semiconductors, and/or the like, and/or combinations thereof.

As depicted, the bottom electrode 14 is substantially covered with the control layer 28 and the connecting layer 16. In this embodiment, the layers 28, 16 are established via a process that disposes the materials such that they substantially conform to/blanket the bottom electrode 14.

FIG. 5 illustrates that the top electrode 12 and the control layer 26 may be patterned such that they cover a portion of the connecting layer 16. It is to be understood that some or all of the various layers 16, 26, 28 and/or the electrodes 12, 14 may be patterned. As such, any desirable combination of layers 16, 26, 28 and the electrodes 12, 14 may be patterned and/or left unpatterned. Non-limitative examples of suitable patterning techniques include conventional semiconductor lithography, nanoimprint lithography, and/or the like. In another embodiment, the electrodes 12, 14 and/or the layers 16, 26, 28 may be self-assembled into a desirable pattern.

Figure 6:
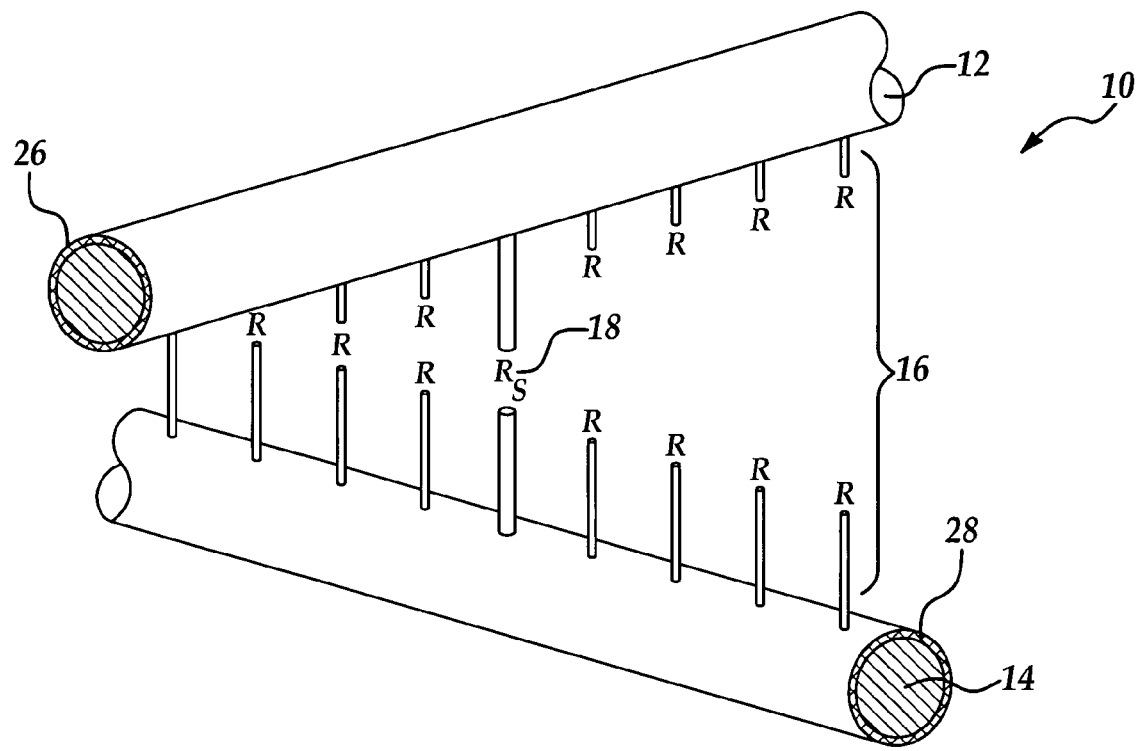
FIG. 6 is a perspective elevational schematic view, depicting two crossed-wires, with a connecting layer and at least one molecule at the intersection of the two wires.

Referring now to FIG. 6, a crossed wire switching device 10 includes two wires (e.g. electrodes) 12, 14, each either a metal and/or semiconductor wire, that are crossed at some substantially non-zero angle. The wires 12, 14 are each coated with a respective control layer 26, 28. Disposed between wires 12, 14 is the connecting layer 16 of materials, molecules and/or molecular compounds. In this example embodiment, the connecting layer 16 includes an active molecule(s) 18 that is/are sandwiched at the intersection (also interchangeably referred to herein as a junction) of the two wires 12, 14, and is/are identified as switch molecules $R_s$. While wires 12, 14 are depicted as having substantially circular cross-sections in FIG. 6, it is to be understood that other cross-sectional geometries are contemplated as being within the purview of the present disclosure, such as, for example, ribbon-like geometries, substantially rectangular geometries, substantially square geometries, non-regular geometries, and the like.

It is to be understood that the active areas of the connecting layer 16 may be switched via electrochemical and/or electrophysical methods. Non-limitative examples of such methods include electromigration, chemical reactions, phase changes, diffusion, species redistribution, phase segregation, or combinations thereof. Electromigration may result when the device 10 is under the influence of an electric field, electric potential, electric current, or combinations thereof. It is to be understood that such influences may result in a temperature change. Chemical reactions (other than the redox reaction described hereinbelow) include the formation of an electronic conducting channel triggered by an electric field, an electric current, a potential change, a temperature change, or combinations thereof. Further, diffusion, species redistribution, and phase segregation may be driven by an electric field, electric potential, electric current, a temperature change, or combinations thereof.

The switches 10 described herein typically have two states, and may be either irreversibly switched from a first state to a second state or reversibly switched from a first state to a second state. In the latter case, there are two possible conditions: either the electric field (or other condition, such as, for example a potential change) may be removed after switching into a given state, and the molecule will remain in that state ("latched") until a reverse field (condition) is applied to switch the molecule back to its previous state; or removal of the electric field (condition) causes the molecule to revert to its previous state, and hence the field (condition) must be maintained in order to keep the molecule in the switched state until it is desired to switch the molecule to its previous state. It is to be understood that the switching mechanisms described hereinabove are illustrative examples, and are not meant to limit the scope of the present disclosure.

As briefly mentioned above, the connecting layer 16 may be altered via diffusion of material(s) and/or ions into or out of the connecting layer 16. In this embodiment(s), the control layer(s) 26, 28 may act as a source or sink of materials and/or ions, thereby controlling the changes that take place in the connecting layer 16. Such changes/alterations may result in the switching of the device 10.

There may be other methods of operating the switches 10, depending on the nature of the connecting layer 16. In an embodiment, the connecting layer 16 includes a switch molecule 18 (for example, an organic or inorganic material) that, under the influence of an electrical (E) field, switches between two or more energetic states, such as by an electrochemical oxidation/reduction (redox) reaction or by a change in the band gap of the molecule 18 induced by the applied E-field.

In the former case, when an appropriate voltage is applied across the wires/electrodes 12, 14, the switch molecules $R_s$, control layers 26, 28, and/or particles embedded within the connecting layer 16 are either oxidized or reduced. When a molecule is oxidized (reduced), then a second species is reduced (oxidized) so that the charge is balanced. These two species are then called a redox pair. In an example, a molecule is reduced (oxidized), and one of the wires 12, 14 is oxidized (reduced). In another example, an oxide associated with the control layers 26, 28 (e.g. $PtO_x$) is reduced and a molecule (e.g. a redox molecule in the connecting layer 16) is oxidized. In such cases, oxidation or reduction may affect the tunneling distance or the tunneling barrier height between the two wires 12, 14, thereby exponentially altering the rate of charge transport across the wire junction, and serving as the basis for a switch. Examples of molecules 18 that exhibit such redox behavior include rotaxanes, pseudo-rotaxanes, redox-nanoparticles, and catenanes; see, e.g., U.S. Pat. No. 6,459,095, entitled "Chemically Synthesized and Assembled Electronic Devices", issued Oct. 1, 2002, to James R. Heath et al, the disclosure of which is incorporated herein by reference in its entirety.

Further, the control layers 26, 28 may serve to modulation-dope the electrode 12, 14 with appropriate molecules—either electron-withdrawing groups (Lewis acids, such as boron trifluoride ($BF_3$)) or electron-donating groups (Lewis bases, such as alkylamines) to make them p-type or n-type semiconductors, respectively. The control layers 26, 28 may be any of the materials described herein and may also include modulation-doping coatings, tunneling barriers (e.g., oxides), or other nano-scale functionally suitable materials.

In the latter case, examples of connecting layer 16 based on field induced changes include E-field induced band gap changes, such as disclosed and claimed in patent application Ser. No. 09/823,195, filed Mar. 29, 2001, published as Publication No. 2002/0176276 on Nov. 28, 2002, which application is incorporated herein by reference in its entirety. Examples of molecules used in the E-field induced band gap change approach include molecules that evidence molecular conformation change or an isomerization; change of extended conjugation via chemical bonding change to change the band gap; or molecular folding or stretching.

Changing of extended conjugation via chemical bonding change to change the band gap may be accomplished in one of the following ways: charge separation or recombination accompanied by increasing or decreasing band localization;

or change of extended conjugation via charge separation or recombination and π-bond breaking or formation.

Color switch molecular analogs, particularly based on E-field induced band gap changes, are also known; see, e.g., U.S. Pat. No. 6,763,158, entitled "Molecular mechanical devices with a band gap change activated by an electric field for optical switching applications", issued on Jul. 13, 2004, to Xiao-An Zhang et al., which is incorporated herein by reference in its entirety.

Figure 7:
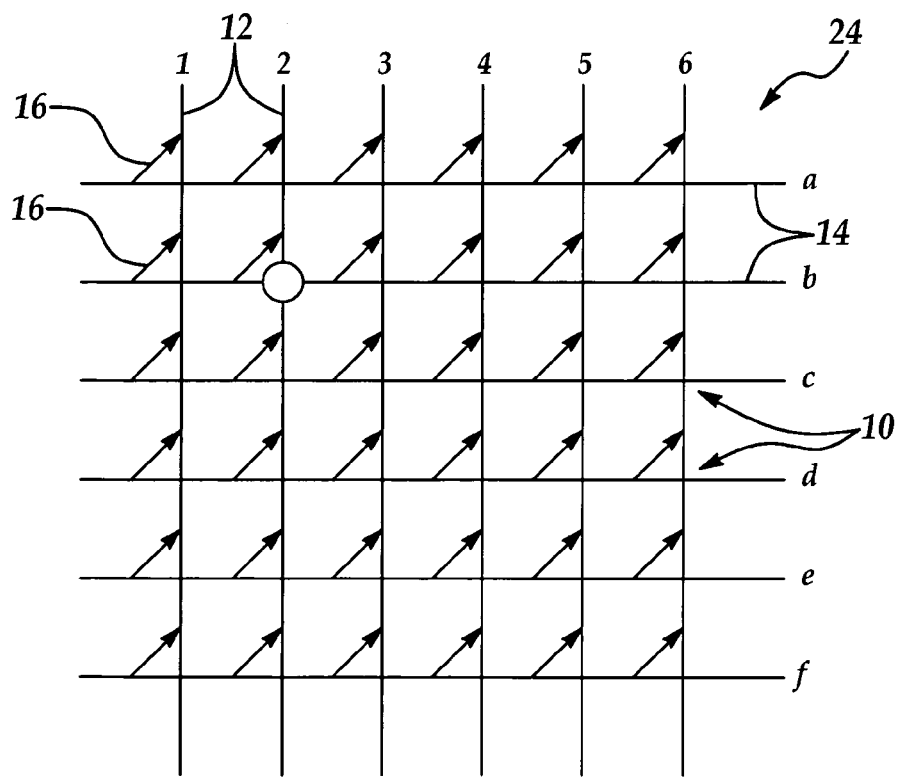
FIG. 7 is a schematic representation of a two-dimensional array of switches, depicting a 6×6 crossbar switch.

Referring now to FIG. 7, the switch 10 may be replicated in a two-dimensional array to form a plurality/array 24 of switches 10 to form a crossbar switch. FIG. 7 depicts a 6×6 array 24. However, it is to be understood that the embodiments herein are not to be limited to the particular number of elements, or switches 10, in the array 24. Access to a single point, e.g., 2b, is accomplished by impressing voltage on wires 2 and b to cause a change in the state of the connecting layer 16 at the junction thereof, as described above. Thus, access to each junction is readily available for configuring those that are pre-selected. Details of the operation of the crossbar switch array 24 are further discussed in U.S. Pat. No. 6,128,214, entitled "Molecular Wire Crossbar Memory", issued on Oct. 3, 2000, to Philip J. Kuekes et al., which is incorporated herein by reference in its entirety.

Embodiments of the present disclosure offer many advantages, including, but not limited to the following. Embodiment(s) of the switching mechanism 10 may be used in electronic and/or optical devices. The control layer(s) 26, 28 advantageously enable control of the electrophysical or electrochemical reaction paths, thus enabling control of the device properties. Further, the control layer(s) 26, 28 substantially enhance device performance, including, but not limited to thermal stability, chemical stability, speed, reliability, life span, or combinations thereof.

While several embodiments have been described in detail, it will be apparent to those skilled in the art that the disclosed embodiments may be modified. Therefore, the foregoing description is to be considered exemplary rather than limiting.

What is claimed is:

1. A control layer for use in a junction of a nanoscale electronic switching device, the control layer comprising a material that 1) is chemically compatible with a connecting layer and at least one electrode in the nanoscale switching device and 2) is a source of a material for the connecting layer or a sink for a material from the connecting layer, the control layer configured to control at least one of electrochemical reaction paths, electrophysical reaction paths, and combinations thereof during operation of the device.

2. The control layer as defined in claim 1 wherein the control layer includes at least one sub-layer.

3. The control layer as defined in claim 1, wherein the control layer is established in a junction formed by a top electrode crossing a bottom electrode at a non-zero angle, wherein the control layer is established between the connecting layer and at least one of the top electrode and the bottom electrode.

4. The control layer as defined in claim 1 wherein the control layer enhances device performance selected from thermal stability, chemical stability, speed, reliability, life span, and combinations thereof.

5. The control layer as defined in claim 1 wherein the at least one control layer is substantially compatible with subsequent processing techniques selected from semiconductor processing and roll-to-roll electronic manufacturing processing.

6. The control layer as defined in claim 1 wherein the at least one control layer includes a substantially stable compound selected from pnictides, chalcogenides, carbides, silicides, germanides, organic monolayers, organic multilayers, organic thin films, and combinations thereof.

7. The control layer as defined in claim 6 wherein the at least one control layer is selected from platinum oxide, TiG, $TiO_2$, $Ti_2O_3$, $Ti_xO_y$ where $2y/x$ is an integer, titanium carbide, $Al_2O_3$, $Ag2O$, WO, $WO_3$, $Ta_2O_5$, $TaO_2$, silicon oxide, silicon nitride, silver, $CuI_2$, $Pt(OH)_2$, $CuCl_2$, copper, and combinations thereof.

8. The control layer as defined in claim 1 wherein the control layer is a substantially homogeneous or heterogeneous thin film.

9. A nanoscale electronic switching device, comprising:
at least one bottom electrode;
at least one top electrode, the at least one top electrode crossing the at least one bottom electrode at a non-zero angle, thereby forming a junction;
at least one connecting layer operatively disposed in the junction, the at least one connecting layer adapted to facilitate electronic switching via at least one of electrochemical reactions, electrophysical reactions, and combinations thereof; and
at least one control layer established between the at least one connecting layer and at least one of the at least one bottom electrode and the at least one top electrode, the at least one control layer being a source of a material for the at least one connecting layer or a sink for a material from the at least one connecting layer, and the at least one control layer adapted configured to control at least one of electrochemical reaction paths, electrophysical reaction paths, and combinations thereof during operation of the device.

10. The nanoscale electrical switching device as defined in claim 9 wherein the at least one control layer enhances at least one of thermal stability, chemical stability, speed, reliability, life span, or combinations thereof.

11. The nanoscale electrical switching device as defined in claim 9 wherein at least one of the at least one control layer or the at least one connecting layer is substantially compatible with subsequent semiconductor processing selected from CMOS processing, MOS processing, bipolar processing, silicon processing, silicon-germanium processing, gallium arsenide processing, III-V processing, and II-VI semiconductor processing.

12. The nanoscale electrical switching device as defined in claim 9 wherein the at least one control layer includes at least one of organic compounds, inorganic compounds, or combinations thereof.

13. The nanoscale electrical switching device as defined in claim 12 wherein the at least one control layer includes a substantially stable compound selected from pnictides, chalcogenides, carbides, silicides, germanides, organic monolayers, organic multilayers, organic thin films, or combinations thereof.

14. The nanoscale electrical switching device as defined in claim 13 wherein the at least one control layer is selected from platinum oxide, TiO, $TiO_2$, $Ti_2O_3$, $Ti_xO_y$ where $2y/x$ is an integer, titanium carbide, $Al_2O_3$, $Ag2O$, WO, $WO_3$, $Ta_2O_5$, $TaO_2$, silicon oxide, silicon nitride, silver, $CuI_2$, $Pt(OH)_2$, $CuCl_2$, copper, and combinations thereof.

15. The nanoscale electrical switching device as defined in claim 9 wherein the at least one connecting layer includes at least one of organic compounds, inorganic compounds, or combinations thereof.

16. The nanoscale electrical switching device as defined in claim 15 wherein the at least one connecting layer is selected from pnictides, chalcogenides, alkanes, carboxylic acids, pthalocyanines, porphyrins, zeolites, semiconductors, and combinations thereof, and wherein the at least one connecting layer is less stable than the at least one control layer.

17. The nanoscale electrical switching device as defined in claim 16 wherein the at least one connecting layer is selected from Ag2S, polyaniline, cadmium stearate, copper sulfides, germanium selenides, germanium silver selenides, platinum oxides, $Ti_3O_5$, $Ti_xO_y$ where $2y/x$ is not an integer, titanium carbides, $Al_xO_y$ where x is not 2 and y is not 3, $Ag_xO_y$ where x is not 2 and y is not 1, WO, $W_xO_y$ where y is not 2 or 3, $Ta_xO_y$ except $TaO_2$ and $Ta_2O_5$, $C_{16}H_{32}O_2$, $C_{17}H_{34}O_2$, $C_{18}H_{36}O_2$, $C_{19}H_{38}O_2$, $C_{20}H_{40}O_2$, $C_{21}H_{42}O_2$, $C_{22}H_{44}O_2$, $C_{14}H_{12}Cl_2N_4O_2$, $C_{15}H_{16}N_2O_3$, and combinations thereof.

18. The nanoscale electrical switching device as defined in claim 9 wherein at least one of the at least one bottom electrode and the at least one top electrode are formed from a material selected from metallic elements, metallic compounds, metallic alloys, semiconducting elements, semiconducting compounds, semiconducting alloys, conductive organic compounds, and combinations thereof.

19. The nanoscale electrical switching device as defined in claim 9 wherein the at least one connecting layer has a substantially heterogeneous composition including at least one of nanoparticles or phase-segregated compounds embedded therein.

20. The nanoscale electrical switching device as defined in claim 9 wherein the material is selected from dopants, metal ions, metals, and combinations thereof.

21. The nanoscale electrical switching device as defined in claim 9 wherein the control layer is the source and the material is ions.

22. The nanoscale electrical switching device as defined in claim 9 wherein the control layer is at least one of the source or the sink and the material is dopants.

23. The nanoscale electrical switching device as defined in claim 9 wherein the control layer is the source and the material is metal for growth of nanoparticles.

24. The nanoscale electrical switching device as defined in claim 9 wherein the control layer is the source and the material is metal for growth of at least one of filaments, nanowires, or combinations thereof.

25. The nanoscale electronic switching device as defined in claim 9 wherein the material is electrically driven into the connecting layer or wherein the material is electrically driven out of the connecting layer.

26. A method of forming a nanoscale electrical switching device, the method comprising:

crossing at least one top electrode with at least one bottom electrode at a non-zero angle, thereby forming a junction; and operatively disposing at least one connecting layer in the junction, the at least one connecting layer adapted to facilitate electronic switching via at least one of electrochemical reactions, electrophysical reactions, and combinations thereof; and operatively forming at least one control layer between the at least one connecting layer and at least one of the at least one bottom electrode and the at least one top electrode, the at least one control layer being a source of a material for the connecting layer or a sink for a material from the connecting layer and configured to control at least one of electrochemical reaction paths, electrophysical reaction paths, and combinations thereof during operation of the device.

27. The method as defined in claim 26 wherein the at least one control layer is formed via a reaction between the at least one connecting layer and at least one of the at least one bottom electrode and the at least one top electrode.

28. The method as defined in claim 26 wherein the at least one control layer is formed by depositing a control layer material between the at least one connecting layer and at least one of the at least one bottom electrode and the at least one top electrode.

29. The method as defined in claim 26 wherein the at least one control layer includes at least two sub-layers, and the method further comprises establishing the at least two sub-layers sequentially.

30. The method as defined in claim 29 wherein the at least two sub-layers are substantially homogeneous or heterogeneous thin films.

* * * * *

UNITED STATES PATENT AND TRADEMARK OFFICE
CERTIFICATE OF CORRECTION

| | | |
|---|---|---|
| PATENT NO. | : 7,741,638 B2 | Page 1 of 1 |
| APPLICATION NO. | : 11/287113 | |
| DATED | : June 22, 2010 | |
| INVENTOR(S) | : Stewart et al. | |

It is certified that error appears in the above-identified patent and that said Letters Patent is hereby corrected as shown below:

In column 3, line 52, delete "pthalocyanines," and insert -- phthalocyanines, --, therefor.

In column 10, line 7, in Claim 7, delete "TiG," and insert -- TiO, --, therefor, In column 10, line 9, in Claim 7, delete "Ag2O," and insert -- $Ag_2O$, --, therefor.

In column 10, lines 30-31, in Claim 9, after "and" delete "the at least one control layer adapted".

In column 10, line 61, in Claim 14, delete "Ag2O," and insert -- $Ag_2O$, --, therefor.

In column 11, line 4, in Claim 16, delete "pthalocyanines," and insert -- phthalocyanines, --, therefor.

In column 11, line 9, in Claim 17, delete "Ag2S," and insert -- $Ag_2S$, --, therefor.

Signed and Sealed this
Eleventh Day of January, 2011

David J. Kappos
*Director of the United States Patent and Trademark Office*

(12) EX PARTE REEXAMINATION CERTIFICATE (9164th)
United States Patent
Stewart et al.

(10) Number: US 7,741,638 C1
(45) Certificate Issued: Jul. 31, 2012

(54) CONTROL LAYER FOR A NANOSCALE ELECTRONIC SWITCHING DEVICE

(75) Inventors: Duncan Stewart, Menlo Park, CA (US); Douglas Ohlberg, Mountain View, CA (US); R. Stanley Williams, Portola Valley, CA (US); Philip J. Kuekes, Menlo Park, CA (US)

(73) Assignee: Hewlett-Packard Development Company, L.P., Houston, TX (US)

Reexamination Request:
No. 90/009,923, Aug. 5, 2011

Reexamination Certificate for:
Patent No.: 7,741,638
Issued: Jun. 22, 2010
Appl. No.: 11/287,113
Filed: Nov. 23, 2005

Certificate of Correction issued Jan. 11, 2011.

(51) Int. Cl.
*H01L 23/58* (2006.01)
*H01L 29/10* (2006.01)
*H01L 29/02* (2006.01)
*H01L 47/00* (2006.01)
*H01L 29/04* (2006.01)

(52) U.S. Cl. .................................. 257/48; 257/2; 257/3
(58) Field of Classification Search .................... None
See application file for complete search history.

(56) References Cited

To view the complete listing of prior art documents cited during the proceeding for Reexamination Control Number 90/009,923, please refer to the USPTO's public Patent Application Information Retrieval (PAIR) system under the Display References tab.

*Primary Examiner* — Robert Nasser

(57) ABSTRACT

A control layer for use in a junction of a nanoscale electronic switching device is disclosed. The control layer includes a material that is chemically compatible with connecting layer and at least one electrode in the nanoscale switching device. The control layer is adapted to control at least one of electrochemical reaction paths, electrophysical reaction paths, and combinations thereof during operation of the device.

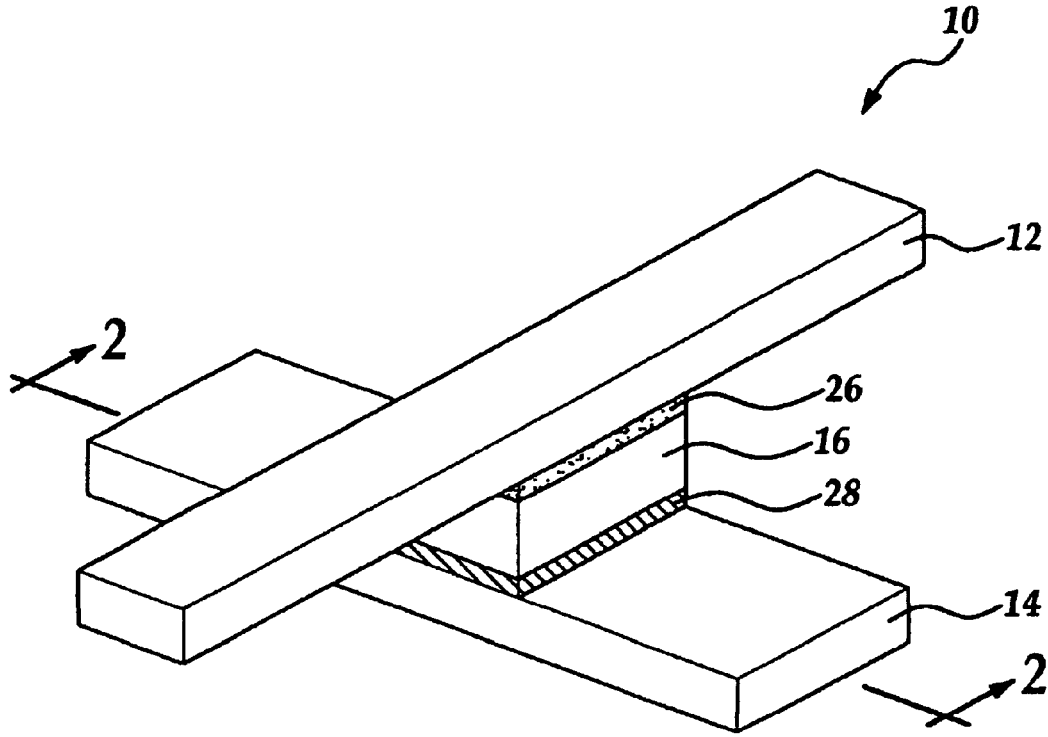

US 7,741,638 C1

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claim 22 is cancelled.

Claims 1, 9, 16, 26 and 27 are determined to be patentable as amended.

Claims 2-8, 10-15, 17-21, 23-25 and 28-30, dependent on an amended claim, are determined to be patentable.

New claims 31-34 are added and determined to be patentable.

1. A control layer for use in a junction of a nanoscale electronic switching device, the control layer comprising a material that 1) is chemically compatible with a connecting layer and at least one electrode in the nanoscale switching device and 2) is a source of a *dopant* material for the connecting layer or a sink for a *dopant* material from the connecting layer, the control layer configured to control at least one of electrochemical reation paths, electrophysical reaction paths, and combinations thereof during operation of the device;
    *wherein the control layer provides said source or sink for dopant material such that a charge of the dopant material responds to an electric field so as to be driven into or out of said connecting layer.*
9. A nanoscale electronic switching device, comprising:
    at least one bottom electrode;
    at least one top electrode, the at least one top electrode crossing the at least one bottom electrode at a non-zero angle, thereby forming a junction;
    at least one connecting layer operatively disposed in the junction, the at least one connecting layer adapted to facilitate electronic switching via at least one of electrochemical reactions, electrophysical reactions, and combinations thereof; and
    at least one control layer established between the at least one connecting layer and at least one of the at least one bottom electrode and the at least one top electrode, the at least one control layer being a source of a *dopant* material for the at least one connecting layer or a sink for a *dopant* material from the at least one connecting layer, and configured to control at least one of electrochemical reaction paths, electrophysical reaction paths, and combinations thereof during operation of the device;
    *wherein the control layer provides said source or sink for dopant material such that a charge of the dopant material responds to an electric field produced by said electrodes so as to be driven into or out of said connecting layer.*
16. [The nanoscale electrical switching device as defined in claim 15] *A nanoscale electronic switching device, comprising:*
    *at least one bottom electrode; at least one top electrode, the at least one top electrode crossing the at least one bottom electrode at a non-zero angle, thereby forming a junction;*
    *at least one connecting layer operatively disposed in the junction, the at least one connecting layer adapted to facilitate electronic switching via at least one of electrochemical reactions, electrophysical reactions, and combinations thereof; and*
    *at least one control layer established between the at least one connecting layer and at least one of the at least one bottom electrode and the at least one top electrode, the at least one control layer being a source of a material for the at least one connecting layer or a sink for a material from the at least one connecting layer, and the at least one control layer* adapted *configured to control at least one of electrochemical reaction paths, electrophysical reaction paths, and combinations thereof during operation of the device;*
    wherein the at least one connecting layer includes at least one of organic compounds, inorganic compounds, or combinations thereof; and
    wherein the at least one connecting layer is selected from pnictides, chalcogenides, alkanes, carboxylic acids, patthalocyanines, porphyrins, zeolites, semiconductors, and combinations thereof, and wherein the at least one connecting layer is less stable than the at least one control layer.
26. A method of forming a nanoscale electrical switching device, the method comprising:
    crossing at least one top electrode with at least one bottom electrode at a non-zero angle, thereby forming a junction; and
    operatively disposing at least one connecting layer in the junction, the at least one connecting layer adapted to facilitate electronic switching via at least one of electrochemical reactions, electrophysical reactions, and combinations thereof; and
    operatively forming at least one control layer between the at least one connecting layer and at least one of the at least one bottom electrode and the at least one top electrode, the at least one control layer being a source of a *dopant* material for the connecting layer or a sink for a *dopant* material from the connecting layer and configured to control at least one of electrochemical reaction paths, electrophysical reaction paths, and combinations thereof during operation of the device;
    *wherein the dopant material of the connecting layer is driven into or out of the connecting layer by electromigration.*
27. [The method as defined in claim 26] *A method of forming a nanoscale electrical switching device, the method comprising:*
    *crossing at least one top electrode with at least one bottom electrode at a non-zero angle, thereby forming a junction; and*
    *operatively disposing at least one connecting layer in the junction, the at least one connecting layer adapted to facilitate electronic switching via at least one of electrochemical reactions, electrophysical reactions, and combinations thereof; and*
    *operatively forming at least one control layer between the at least one connecting layer and at least one of the at least one bottom electrode and the at least one top electrode, the at least one control layer being a source* of a material for the connecting layer or a sink for a material from the connecting layer and configured to control at least one of electrochemical reaction paths, electrophysical reaction paths, and combinations thereof during operation of the device;
  wherein the at least one control layer is formed via a reaction between the at least one connecting layer and at least one of the at least one bottom electrode and the at least one top electrode.

31. A control layer in a junction of a nanoscale electronic switching device, the control layer comprising a material that 1) is chemically compatible with a connecting layer and at least one electrode in the nanoscale switching device, the control layer being in contact with the connecting layer and 2) is a source of a dopant material that is driven by electromigration into the connecting layer or a sink for a dopant material that is driven by electromigration out of the connecting layer, the control layer configured to control at least one of electrochemical reactions paths, electrophysical reaction paths, and combinations thereof during operation of the device.

32. The control layer of claim 31, wherein the control layer provides said source or sink for dopant material under electrostatically driven diffusion of said dopant material.

33. The method of claim 26, further comprising using electrostatically driven diffusion to move said dopant material in or out of said connecting layer.

34. A control layer for use in a junction of a nanoscale electronic switching device, the control layer comprising a material that 1) is chemically compatible with a connecting layer and at least one electrode in the nanoscale switching device and 2) is a source of a dopant material for the connecting layer or a sink for a dopant material from the connecting layer, the control layer configured to control at least one of electrochemical reaction paths, electrophysical reaction paths, and combinations thereof during operation of the device, wherein the control layer provides said source or sink for dopant material under electrostatically driven diffusion of said dopant material.

* * * * *